(12) United States Patent
Murahashi et al.

(10) Patent No.: US 8,624,406 B2
(45) Date of Patent: Jan. 7, 2014

(54) SEMICONDUCTOR DEVICE, AND METHOD FOR SUPPLYING ELECTRIC POWER TO SAME

(75) Inventors: Shunichi Murahashi, Osaka (JP);
Michihiro Nakahara, Osaka (JP);
Atsushi Maruyama, Osaka (JP);
Hajime Nonomura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 154 days.

(21) Appl. No.: 13/393,443

(22) PCT Filed: Aug. 11, 2010

(86) PCT No.: PCT/JP2010/063641
§ 371 (c)(1),
(2), (4) Date: Feb. 29, 2012

(87) PCT Pub. No.: WO2011/027655
PCT Pub. Date: Mar. 10, 2011

(65) Prior Publication Data
US 2012/0153510 A1      Jun. 21, 2012

(30) Foreign Application Priority Data

Sep. 2, 2009   (JP) ................................ 2009-203100

(51) Int. Cl.
*H01L 23/49*      (2006.01)
(52) U.S. Cl.
USPC ...................... 257/784; 257/203; 257/E27.06
(58) Field of Classification Search
USPC .......... 257/784, E23.024, E21.506, 203, 207, 257/204, E27.06, E23.141; 438/597
See application file for complete search history.

(56) References Cited

U.S. PATENT DOCUMENTS

| | | | |
|---|---|---|---|
| 5,585,666 A | 12/1996 | Imamura | |
| 6,204,567 B1 | 3/2001 | Imamura | |
| 6,703,792 B2 * | 3/2004 | Kawada et al. | 315/169.4 |
| 6,759,732 B1 | 7/2004 | Imamura | |
| 7,863,652 B2 * | 1/2011 | Toyoshima et al. | 257/203 |
| 2007/0290302 A1 | 12/2007 | Nakagawa et al. | |
| 2008/0083937 A1 | 4/2008 | Nomiyama et al. | |
| 2009/0057808 A1 | 3/2009 | Nakayama | |
| 2011/0090005 A1 | 4/2011 | Nakayama | |
| 2011/0242714 A1 * | 10/2011 | Hirota | 361/56 |

FOREIGN PATENT DOCUMENTS

| | | |
|---|---|---|
| JP | 2001-15694 A | 1/2001 |
| JP | 2006-80167 A | 3/2006 |
| JP | 2008-98244 A | 4/2008 |
| JP | 2009-59956 A | 3/2009 |
| KR | 2007-0119530 A | 12/2007 |

OTHER PUBLICATIONS

International Search Report issued in PCT/JP2010/063641, dated Sep. 7, 2010.

* cited by examiner

*Primary Examiner* — Roy Potter
(74) *Attorney, Agent, or Firm* — Birch, Stewart, Kolasch & Birch, LLP

(57) ABSTRACT

Disclosed is a liquid crystal driver having a plurality of output cells (101), wherein operational amplifiers (105), which are components of the output cells (101), are connected to a power wire (109*a*) formed in the liquid crystal driver, which is a semiconductor element. Further, the semiconductor element is mounted on a substrate on which a bypass wire (201) has been formed. The bypass wire (201) is connected to the power wire (109*a*) through bumps (203) for each separate one of the operational amplifiers (105) of all of the output cells.

9 Claims, 7 Drawing Sheets

SEMICONDUCTOR DEVICE, AND METHOD FOR SUPPLYING ELECTRIC POWER TO SAME

TECHNICAL FIELD

The present invention relates to semiconductor devices having integrated circuits, i.e., semiconductor elements, mounted on substrates and, in particular, to a method for supplying electric power to a semiconductor device applicable to a driving circuit of a thin-shaped image display device.

BACKGROUND ART

In recent years, thin-shaped image display devices have been practically used which are constituted by using thin-shaped image display panels such as liquid crystal display panels, plasma image display panel, EL (electroluminescent) image display panels, etc. as image display elements.

These image display devices contain electric circuits in which heat is generated for example from integrated circuits including output-stage transistors, semiconductors, resistors, and transformers. That is, heat is generated intensively from electronic components with great electric power of electro-thermal conversion. Along with high definition or ultra-high definition, a recent image display device has risen in drive frequency at which display signals are supplied to a large number of pixels of the panel. For this reason, in particular, there has been an unignorably large increase in self-heating of an integrated circuit driving the source lines of a display device.

Patent Literature 1 discloses a technique for, in order to reduce the chip size of an integrated circuit, wiring a power supply without drawing inner power wires to power pads surrounding a chip. FIG. 5 shows a schematic view of the layout of a liquid crystal driver (source driver). FIG. 5 is a diagram showing the arrangement of output cells and power wires in the liquid crystal driver, which is an integrated circuit.

The liquid crystal driver has a large number of output cells 101 arranged for driving source lines of liquid crystals. Further, each of the output cells 101 has, as its components, a latch circuit 102, a level shifter 103, a DAC circuit 104, an operational amplifier 105, and a pad 106, for example.

The latch circuit 102 retains data in accordance with which a display is carried out. The level shifter 103 shifts the latched data to a liquid crystal driving power supply level. The DAC circuit 104 outputs a drive voltage corresponding to the data. The operational amplifier 105 makes an impedance conversion of the voltage outputted from the DAC circuit 104 and outputs the voltage. The pad 106 connects the integrated circuit, i.e., the liquid crystal driver, to wires of a package. Each of the output cells 101 has its components linearly arranged as shown in FIG. 5.

Since the components of each of the output cells 101 need to be supplied with electric power, the integrated circuit has power pads 108 disposed therearound. In the case of such disposition of the power pads 108, as shown in FIG. 5, it is necessary to lead wires from the output cells 101 to the power pads 108. In FIG. 5, two power pads 108 are provided to which the operational amplifiers 105 are connected through a wire 109*a*. Similarly, the DAC circuits 104 are connected to the power pads 108 through a wire 109*b*, and the level shifters 103 are connected to the power pads 108 through a wire 109*c*. A power supply for the latch circuits 102 is separate from the power pads 108, and as such, is not described here. In this way, each type of component is supplied with electric power through a separate wire. Such wiring prevents noise attributed to the operation of one type of component from affecting another type of component.

FIG. 6 shows the shape of a film package in which a liquid crystal driver has been mounted. The liquid crystal driver shown in FIG. 6 is a liquid crystal driver 113 mounted on a film package substrate 110. The film package has an output terminal 111 formed in such a way as to extend along one long side of the film package substrate 110, and has an input terminal 112 formed in such a way as to extend along the other long side of the film package substrate 110. The input terminal 112 includes package power terminals connected to the power pads 108 of the liquid crystal driver 113 through wires 114, respectively. FIG. 6 omits to illustrate other input and output wires.

The lead wires 109*a* to 109*c* shown in FIG. 5 need to be low in resistance, and as such, need to be great in line width. In particular, the wire 109*a* for the operational amplifier section generates big switching noise because it is necessary to charge and discharge capacitive loads such as the pixels of a liquid crystal panel through the wire 109*a*. For this reason, it is necessary to connect the operational amplifier section to the power supply through a low-resistance power wire.

FIG. 7 is a diagram of bypassing of a power wire using the technique of Patent Literature 1. As shown in FIG. 7, a bypass wire 201 provided on a tape substrate and a power supply line 109*a* for the operational amplifiers are connected to each other through bumps 202 disposed on the power supply line 109*a*.

FIG. 8 shows the state of a film package in which a liquid crystal driver has been mounted. The film package of FIG. 8 has a bypass wire 201 added as a wire on the film package substrate 110 in addition to the components of FIG. 6. The bypass wire 201 has bumps 202 provided for use in the power wire for the operational amplifiers. The bypass wire 201 is connected to the same power input terminals of the input terminal 112 as the power wires 114.

The foregoing configuration can reduce the resistance of the wires to the power supply from the power pads to the operational amplifier section of the output cells, and as such, can quickly absorb switching noise.

CITATION LIST

Patent Literature 1

Japanese Patent Application Publication, Tokukai, 2006-80167 A (Publication Date: Mar. 23, 2006)

SUMMARY OF INVENTION

Technical Problem

Since, as mentioned above, recent improvements in integrity of integrated circuits have invited a decrease in chip size and an increase in the number of outputs in liquid crystal drivers, too, the generation of heat from drivers per se has become an issue. Such heat generation occurs when an electric current passed through a power wire by operating a driver is discharged in the form of heat due to the resistance of the power wire. Such an operating current is large at the time of switching of a transistor. For this reason, completion of the switching is delayed unless the power supply is stable, with the result that a more electric current flows and leads to the generation of heat from the driver.

The configuration of Patent Literature 1 is intended to reduce the number of wires of a semiconductor element and hence reduce the size and weight of a semiconductor device by forming a bypass wire on a film substrate instead of conventionally leading a power wire in the semiconductor element. Further, the bypass wire allows a larger reduction in resistance than a wire formed in the semiconductor element, whereby the power supply is more stabilized.

Moreover, according to the configuration of Patent Literature 1, it has been believed that a reduction in switching noise and hence suppression of heat generation are achieved through stabilization of the power supply. However, such stabilization of the power supply is not sufficient to reduce the generation of heat from an integrated circuit.

The present invention has been made in view of the foregoing problems, and it is an object of the present invention to provide a semiconductor device having an integrated circuit (semiconductor element) mounted on a substrate, wherein the generation of heat in the integrated circuit is suppressed.

Solution to Problem

In order to solve the foregoing problems, the present invention is directed to a semiconductor device having a semiconductor element mounted on a substrate, the semiconductor element including: a plurality of output cells having plural types of component; and a plurality of power wires through which electric power is supplied to the types of component of all of the output cells, respectively, the substrate including a bypass wire, the bypass wire being connected to at least one of the power wires and having connection terminals for each separate one of those components of substantially all of the output cells which are connected to the at least one of the power wires.

Since, according to the foregoing configuration, the bypass wire is formed on the substrate on which the semiconductor element is mounted, the bypass wire allows a larger reduction in resistance than the power wires formed in the semiconductor element. Moreover, since the bypass wire having connection terminals for each separate one of those components of all of the output cells which are connected to the at least one of the power wires, an electric current that flows when the components of the output cells operate is mostly supplied from the power supply through the bypass wire. This makes it possible to effectively suppress the generation of heat in power wires formed in conventional semiconductor elements. Further, the bypass wire allows efficient heat dissipation because it is greater in width and larger in surface area than the wires on the semiconductor element.

Advantageous Effects of Invention

The present invention is directed to a semiconductor device having a semiconductor element mounted on a substrate, the semiconductor element including: a plurality of output cells having plural types of component; and a plurality of power wires through which electric power is supplied to the types of component of all of the output cells, respectively, the substrate including a bypass wire, the bypass wire being connected to at least one of the power wires and having connection terminals for each separate one of those components of substantially all of the output cells which are connected to the at least one of the power wires.

Therefore, an electric current that flows when the components of the output cells operate is mostly supplied from the power supply through the bypass wire. This brings about an effect of making it possible to effectively suppress the generation of heat in power wires formed in conventional semiconductor elements.

Further, the bypass wire allows efficient heat dissipation because it is greater in width and larger in surface area than the wires on the semiconductor element.

DESCRIPTION OF EMBODIMENTS

An embodiment of the present invention is described in detail below with reference to FIGS. 1 through 4. The present invention is not to be limited to the description of the embodiment below. Further, conditions for each step for use in the present embodiment and the like are the same as those for the usual step of mounting a semiconductor device, and as such, are not described in detail below unless otherwise noted.

Figure 1:
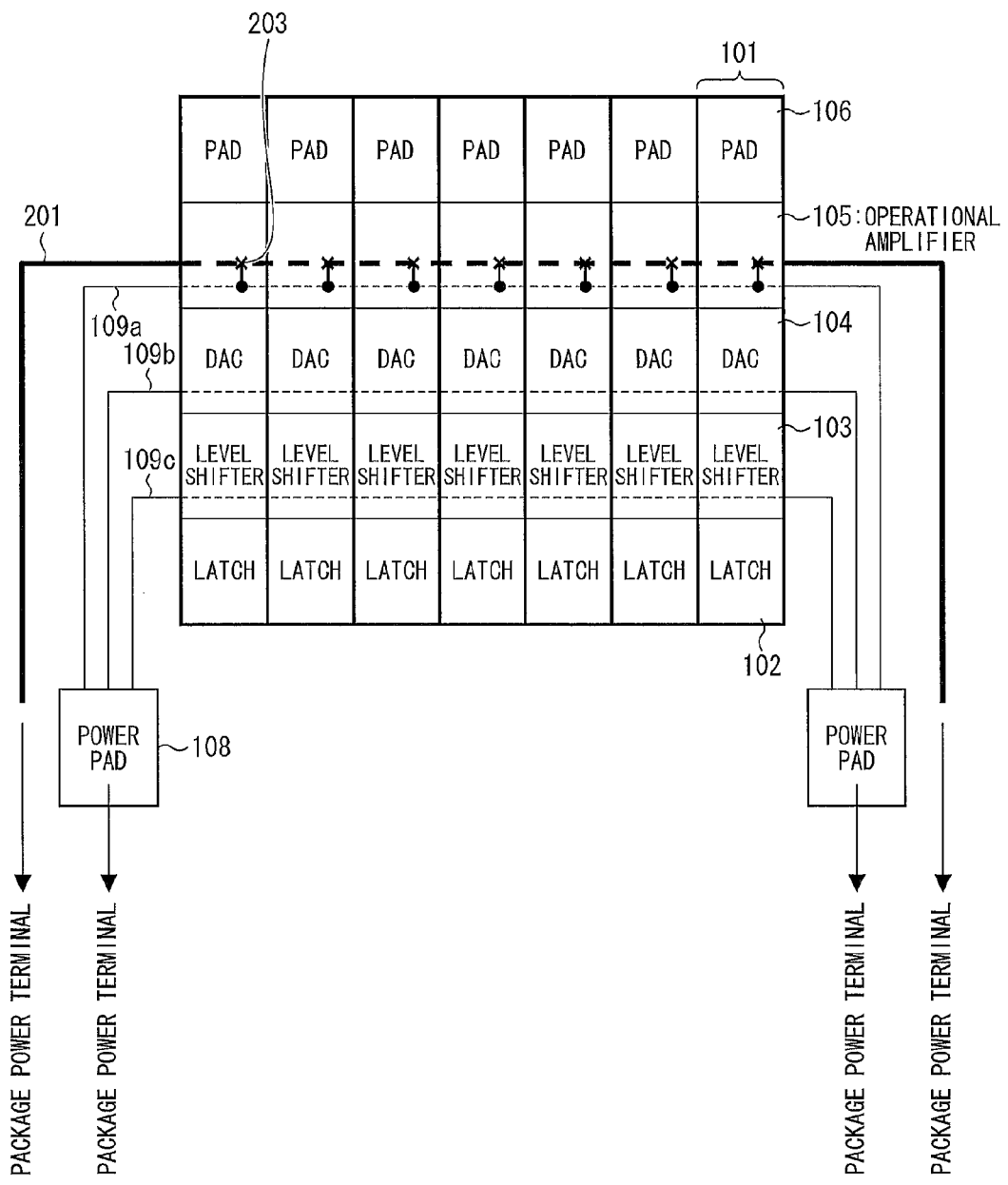
FIG. 1, showing an embodiment of the present invention, is a diagram schematically showing the layout of a liquid crystal driver.

FIG. 1 shows a schematic view of the layout of a liquid crystal driver (which is a source driver here) according to the present embodiment. FIG. 1 is a diagram showing the arrangement of output cells and power wires in the liquid crystal driver, which is an integrated circuit.

The liquid crystal driver has a large number of output cells 101 arranged for driving source lines of liquid crystals. Further, each of the output cells 101 has, as its components, a latch circuit 102, a level shifter 103, a DAC circuit 104, an operational amplifier 105, and a pad 106, for example.

Figure 5:
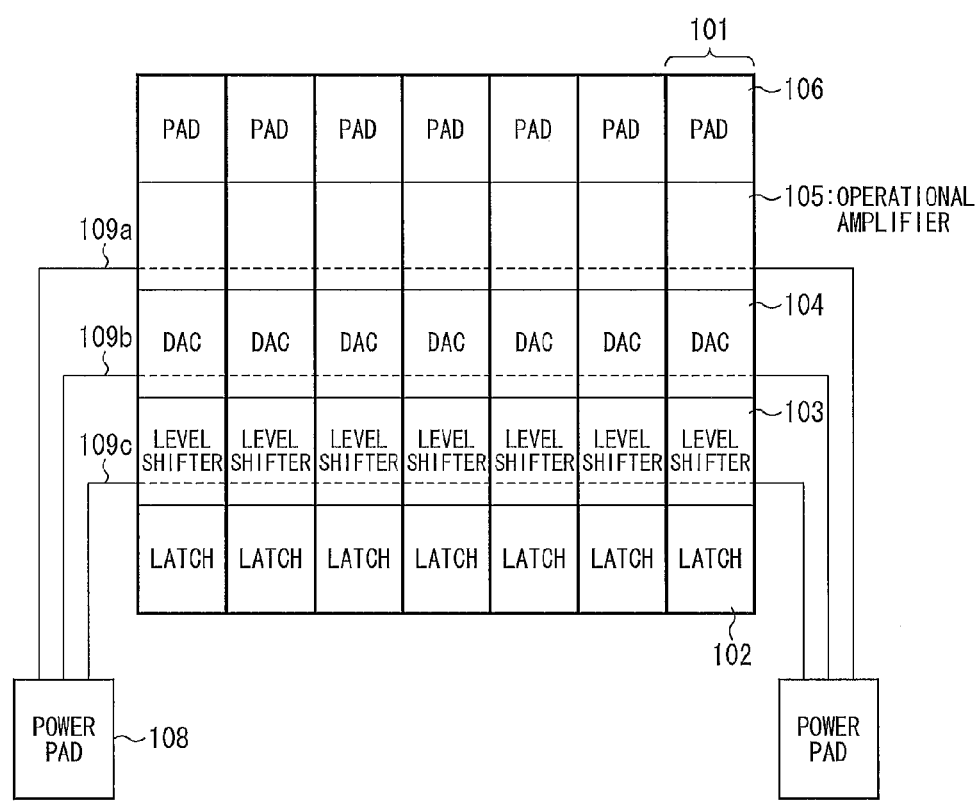
FIG. 5 is a diagram schematically showing the layout of a conventional liquid crystal driver.
Figure 6:
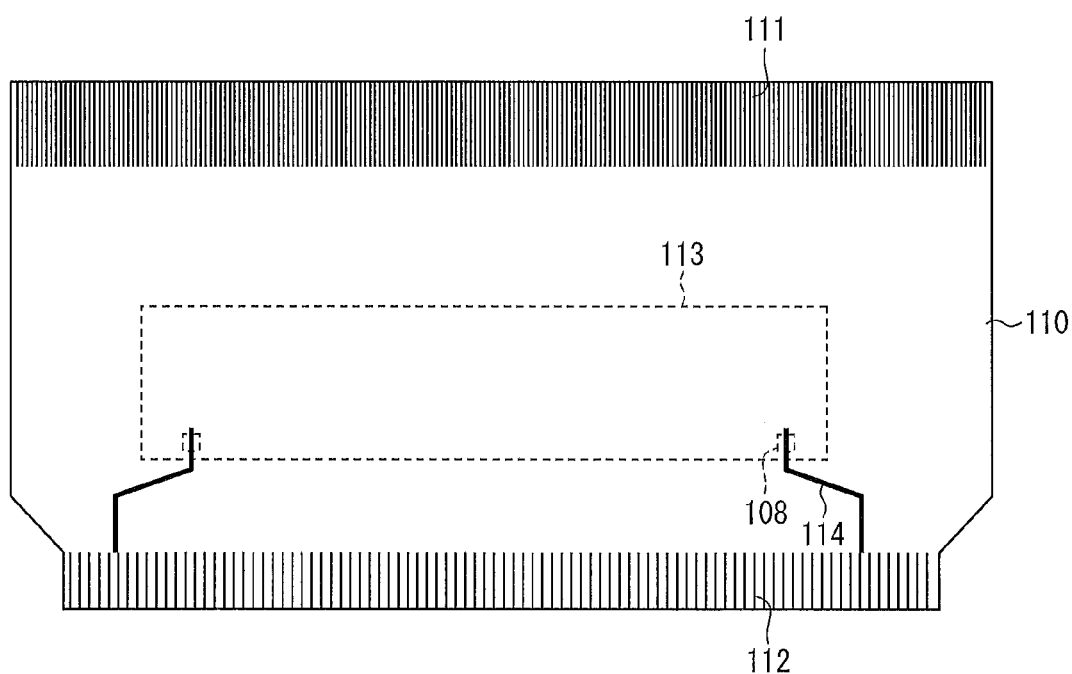
FIG. 6 is a plan view showing the shape of a film package in which a conventional liquid crystal driver has been mounted.
Figure 7:
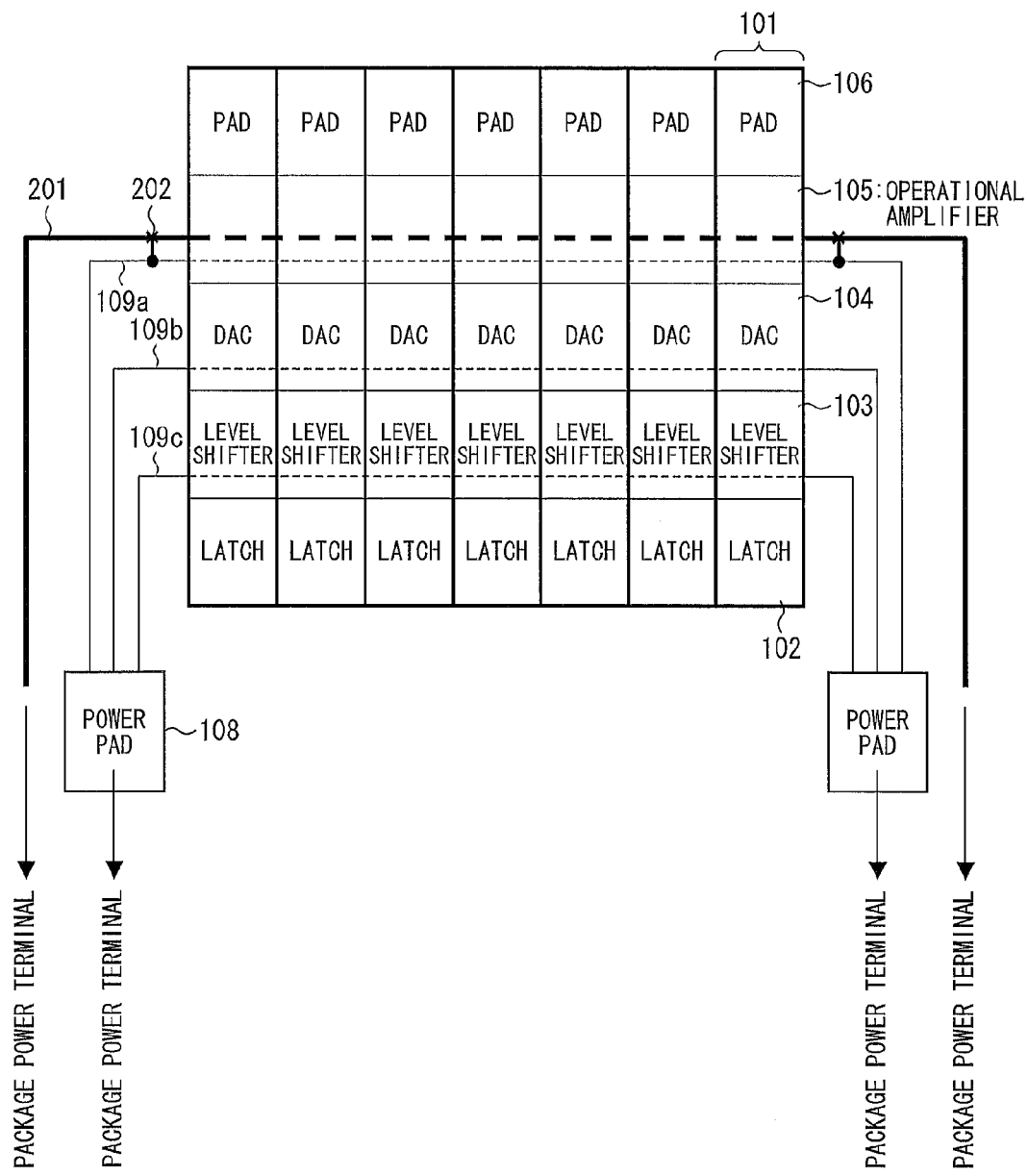
FIG. 7 is a diagram schematically showing the layout of a conventional liquid crystal driver including a bypass wire.
Figure 8:
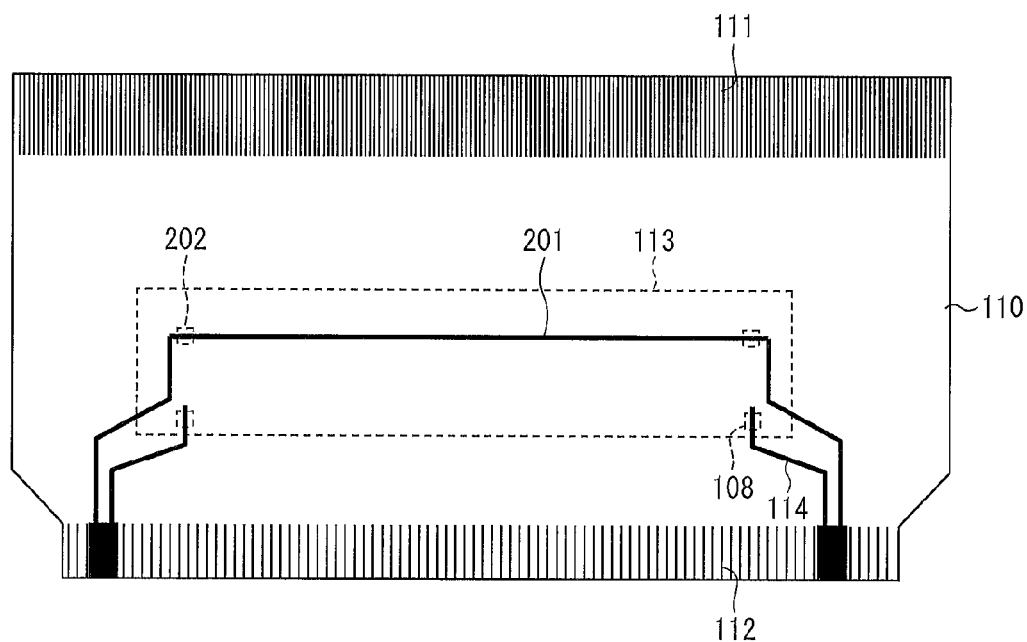
FIG. 8 is a plan view showing the shape of a film package in which a conventional liquid crystal driver including a bypass wire has been mounted.

Since the components of each of the output cells 101 need to be supplied with electric power, the integrated circuit has power pads 108 disposed therearound, and wires are led from the output cells 101 to the power pads 108. In FIG. 1, two power pads 108 are provided to which the operational amplifiers 105 are connected through a wire 109*a*. Similarly, the DAC circuits 104 are connected to the power pads 108 through a wire 109*b*, and the level shifters 103 are connected to the power pads 108 through a wire 109*c*. A power supply for the latch circuits 102 is separate from the power pads 108, and as such, is not described here. In this way, each type of component is supplied with electric power through a separate wire. The wires 109*a* to 109*c* are wires formed in the integrated circuit, which is a liquid crystal driver, i.e., in a semiconductor element. These components are the same as those of the conventional liquid crystal driver shown in FIG. 5.

Figure 2:
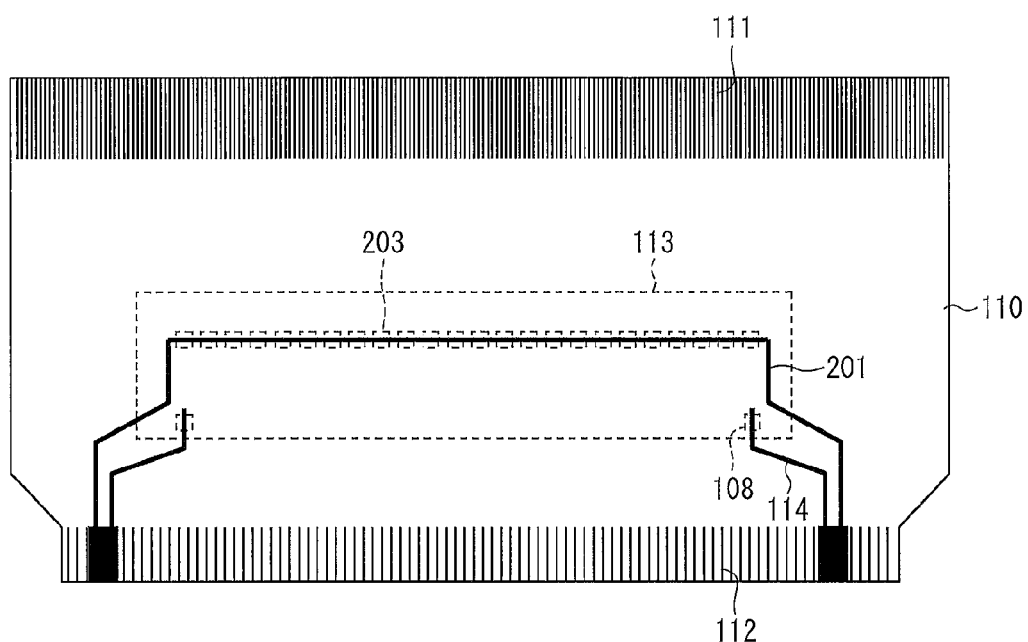
FIG. 2 is a plan view showing the shape of a film package in which the liquid crystal driver has been mounted.

FIG. 2 shows the shape of a film package in which a liquid crystal driver has been mounted. The liquid crystal driver shown in FIG. 2 is a liquid crystal driver 113 mounted on a film package substrate 110. The film package has an output terminal 111 formed in such a way as to extend along one long side of the film package substrate 110, and has an input terminal 112 formed in such a way as to extend along the other long side of the film package substrate 110. The input terminal 112 includes package power terminals connected to the power pads 108 of the liquid crystal driver 113 through wires 114, respectively. FIG. 2 omits to illustrate other input and output wires.

Furthermore, the film package of FIG. 2 has its bypass wire 201 added as a wire on the film package substrate 110, and the bypass wire 201 has bumps 203 through which the bypass wire 201 formed on the film package substrate 110 and the wires 109 formed in the liquid crystal driver 113 are electrically connected. An example of the bypass wire 201 here is one provided to the power wire 109a for the operational amplifiers 105. The bypass wire 201 is connected to the same power input terminals of the input terminal 112 as the power wires 114.

In the configuration of the present embodiment, the bumps 203 are provided for each separate one of all of the output cells. That is, in a case where the liquid crystal driver 113 has n output cells, there are provided n bumps 203, too. In other words, the bypass wire 201 has bumps 203 for each separate one of the operational amplifiers 105 of all of the output cells, and is connected to the power wire 109a. This allows the power supply of each output buffer to be connected to the bypass wire 201. However, in the present invention, the bypass wire does not necessarily need to be connected to each separate one of the components of all of the output cells. There may be some output cells that do not have bumps (that is, the bypass wire may be connected to each separate one of the components of substantially all of the output cells).

Figure 3:
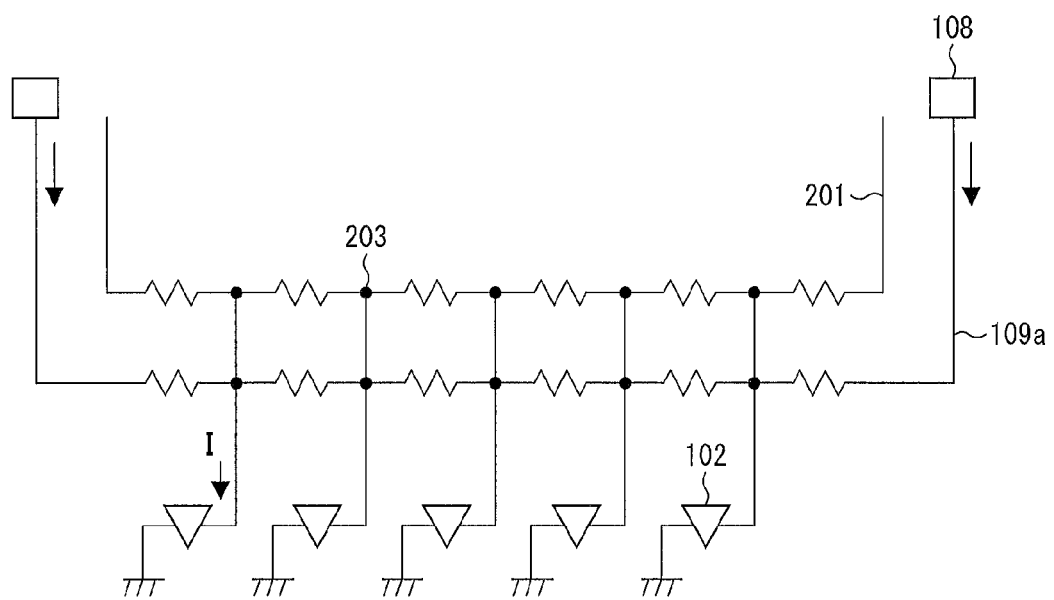
FIG. 3 is a circuit diagram taking into account the wiring resistance of power wires in the liquid crystal driver.

FIG. 3 is a diagram taking into account the wiring resistance of the power wires in FIGS. 1 and 2. An electric current I that flows when operational amplifiers 102 operate is mostly supplied from the power supply through the bypass wire 201. This is because the bypass wire 201 formed on the package is lower in resistance than the wire 109a formed in the liquid crystal driver 113, which is a semiconductor element. As a specific example, the bypass wire 201 can be configured to have a resistance value smaller than $1/10$ the resistance value of the wire 109a so that less heat is generated in the bypass wire 201. Further, the bypass wire 201 allows efficient heat dissipation because it is greater in width and larger in surface area than the wires on the integrated circuit.

Although, in the present embodiment, the measures against heat by the bypass wire are taken only for the power wire for the operational amplifiers, such measures can be taken for all of the power wires on the liquid crystal driver. However, this makes it necessary, as shown in FIG. 2, to form bumps in substantially all of the output cells, and such formation of bumps causes some increase in chip size. For this reason, such measures should be taken especially for a power wire through which a large current flows during switching. In the case of a liquid crystal driver, such measures are effectively taken for buffer circuits of output operational amplifiers. Further, in the case of an operational amplifier, such measures can be taken only for a power wire for an output buffer of the last stage.

Figure 4:
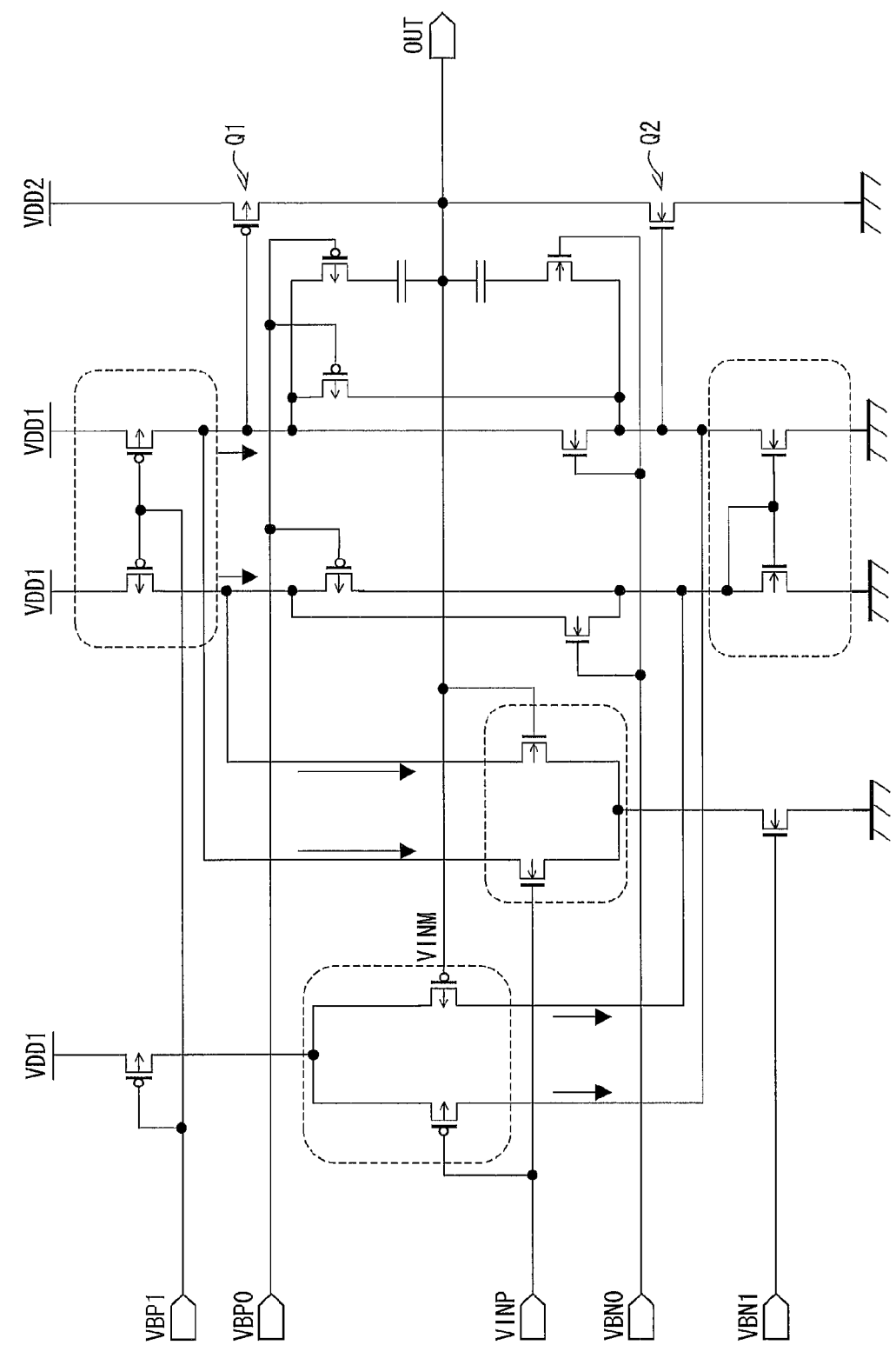
FIG. 4 is a circuit diagram showing a typical rail-to-rail operational amplifier.

FIG. 4 shows a typical rail-to-rail operational amplifier. It should be noted that the operational amplifier in FIG. 4 is a well-known component that is commonly used in a liquid crystal driver, and as such, is not described in detail as a whole.

Since, in the case of a liquid crystal driver, the output cells are elongated as described above, the circuitry of each operational amplifier is often constituted by two transistors that are large in transistor size, namely a transistor Q1 and a transistor Q2. In this case, the operational amplifier has its power supply VDD divided into a power supply VDD2 connected to the transistors Q1 and Q2 of the output stage and a power supply VDD1 connected to the other members. In the case of such division, the measures against heat by the bypass wire is effectively taken for the power supply VDD2, which drives the loads of a liquid crystal panel.

Furthermore, examples of results of measurements of devices in which measures were taken against heat as described in the present embodiment are shown below in Table 1. It should be noted that in the results below, Devices A and B are devices (comparative examples) in which such measures were not taken against heat, and Device C is a device in which such measures were taken against heat. Further, assuming the chip size of Device A is 100, the ratio of chip size of Device B to Device A is 53 and the ratio of chip size of Device C to Device A is 46. The measurement results were obtained by causing the liquid crystal drivers to carry out such driving that a display pattern most likely to cause heat generation was displayed and by finding saturation temperatures reached when no measures were taken to dissipate heat.

TABLE 1

|  | Temperature measurement results |
| --- | --- |
| Device A (chip size 100) | 190° C. |
| Device B (chip size 53) | 240° C. |
| Device C (chip size 46) | 190° C. |

As shown above in Table 1, whereas Device A generated a heat of 190° C., Device B, which is equivalent in function to Device A, generated a heat of 240° C. It should be noted here that although Device B is equivalent in function to Device A, Device B is a device whose chip size has been reduced by miniaturization of the wires and the like. Therefore, in Device B, the miniaturized wires caused increased resistance and hence an increased amount of heat generated.

Furthermore, Device C, which is equivalent in function to Devices A and B, is a device whose chip size has been more reduced than that of Device B by miniaturization of the wires and the like. Without measures being taken against heat as described in the present embodiment, Device C would reach a temperature equal to higher than that of Device B. However, since heat generation was suppressed by taking measures against heat as described in the present embodiment, the result of measurement of the temperature of the device was 190° C.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can suppress the generation of heat in a semiconductor device and, for example, can be used for a driving circuit of a thin-shaped display device such as a liquid crystal display device.

| Reference Signs List | |
|---|---|
| 101 | Output cell |
| 102 | Latch circuit |
| 103 | Level shifter (components of output cell) |
| 104 | DAC circuit (components of output cell) |
| 105 | Operational amplifier (components of output cell) |
| 106 | Pad |
| 108 | Power pad |
| 109a to 109c | Power wire |
| 110 | Film package substrate |
| 113 | Liquid crystal driver (semiconductor element) |
| 201 | Bypass wire |
| 203 | Bump (connection terminal) |

The invention claimed is:

1. A semiconductor device having a semiconductor element mounted on a substrate,
the semiconductor element comprising:
a plurality of output cells having plural types of component; and
a plurality of power wires through which electric power is supplied to the types of component of all of the output cells, respectively,
the substrate comprising a bypass wire,
the bypass wire being connected to at least one of the power wires and having connection terminals for each separate one of those components of substantially all of the output cells which are connected to the at least one of the power wires.

2. The semiconductor device as set forth in claim 1, wherein:
the output cells include output buffers; and
the connection terminals are disposed on that one of the power wires which is connected to a power supply for the output buffers.

3. The semiconductor device as set forth in claim 2, wherein the output buffers are operational amplifiers.

4. The semiconductor device as set forth in claim 3, wherein the connection terminals are disposed on that one of the power wires which is connected to last output stages of the operation amplifiers.

5. The semiconductor device as set forth in claim 1, wherein the semiconductor element is a driving integrated circuit of a display device.

6. A method for supplying electric power to a semiconductor device having a semiconductor element mounted on a substrate,
the semiconductor element comprising:
a plurality of output cells having plural types of component; and
a plurality of power wires through which electric power is supplied to the types of component of all of the output cells, respectively,
the substrate comprising a bypass wire,
the method comprising connecting the bypass wire to each separate one of those components of substantially all of the output cells which are connected to at least one of the power wires and thereby supplying electric power to those components through the bypass wire.

7. The method as set forth in claim 6, wherein:
the output cells include output buffers; and
the connection terminals are disposed on that one of the power wires which is connected to a power supply for the output buffers.

8. The method as set forth in claim 7, wherein the output buffers are operational amplifiers.

9. The method as set forth in claim 8, wherein the connection terminals are disposed on that one of the power wires which is connected to last output stages of the operation amplifiers.

* * * * *